(12) United States Patent
Zhao

(10) Patent No.: US 11,442,565 B2
(45) Date of Patent: Sep. 13, 2022

(54) FLEXIBLE INTEGRATED DISPLAY MODULE, MANUFACTURING METHOD THEREOF, AND DISPLAY DEVICE

(71) Applicant: Wuhan China Star Optoelectronics Semiconductor Display Technology Co., LTD., Wuhan (CN)

(72) Inventor: Jinrong Zhao, Wuhan (CN)

(73) Assignee: Wuhan China Star Optoelectronics Semiconductor Display Technology Co., LTD., Wuhan (CN)

( * ) Notice: Subject to any disclaimer, the term of this patent is extended or adjusted under 35 U.S.C. 154(b) by 275 days.

(21) Appl. No.: 16/633,401

(22) PCT Filed: Sep. 20, 2019

(86) PCT No.: PCT/CN2019/107045
§ 371 (c)(1),
(2) Date: Jan. 23, 2020

(87) PCT Pub. No.: WO2021/027021
PCT Pub. Date: Feb. 18, 2021

(65) Prior Publication Data
US 2021/0405790 A1     Dec. 30, 2021

(30) Foreign Application Priority Data
Aug. 12, 2019   (CN) .......................... 201910739129.7

(51) Int. Cl.
G06F 3/041      (2006.01)
G06F 3/044      (2006.01)
(Continued)

(52) U.S. Cl.
CPC .......... *G06F 3/0412* (2013.01); *G06F 3/0443* (2019.05); *G06F 3/04164* (2019.05); *H01L 21/4846* (2013.01); *H01L 23/5387* (2013.01); *H01L 24/83* (2013.01); *H01L 25/18* (2013.01); *H01L 25/50* (2013.01);
(Continued)

(58) Field of Classification Search
CPC .. G06F 3/0412; G06F 3/04164; G06F 3/0443; G06F 2203/04102; G06F 2203/04103; H01L 21/4846; H01L 23/5387; H01L 24/83; H01L 25/18;
(Continued)

(56) References Cited

U.S. PATENT DOCUMENTS

2014/0063097 A1\* 3/2014 Liu .................. G06F 3/0443
                                                       347/12
2018/0164933 A1\* 6/2018 Jun .................. G06F 3/0445
(Continued)

*Primary Examiner* — Afroza Chowdhury
(74) *Attorney, Agent, or Firm* — PV IP PC; Wei Te Chung; Ude Lu

(57) ABSTRACT

The present invention discloses a flexible integrated display panel module and manufacturing method thereof, the flexible integrated display panel module includes a flexible integrated display substrate, which including an integrated area, an active area and a non-display disposed at one side of the integrated area, the integrated area divided into a plurality of areas, used to defined as a corresponding functional area. The functional area includes: a display wiring functional area and a plurality of direct on-cell touch control wiring functional areas disposed on both sides of the display functional area.

8 Claims, 5 Drawing Sheets

(51) Int. Cl.
*H01L 25/18* (2006.01)
*H01L 23/538* (2006.01)
*H01L 21/48* (2006.01)
*H01L 23/00* (2006.01)
*H01L 25/00* (2006.01)

(52) U.S. Cl.
CPC ............... *G06F 2203/04102* (2013.01); *G06F 2203/04103* (2013.01); *H01L 2224/83022* (2013.01); *H01L 2224/83192* (2013.01)

(58) Field of Classification Search
CPC ........... H01L 25/50; H01L 2224/83022; H01L 2224/83192
See application file for complete search history.

(56) References Cited

U.S. PATENT DOCUMENTS

2018/0348937 A1* 12/2018 Pak .................... G06F 3/0443
2019/0018528 A1*  1/2019 Higano ............. G02F 1/133305
2020/0033972 A1*  1/2020 Huang ................ G02F 1/13338

* cited by examiner

FLEXIBLE INTEGRATED DISPLAY MODULE, MANUFACTURING METHOD THEREOF, AND DISPLAY DEVICE

FIELD OF INVENTION

The disclosure relates to the flexible display panel technology field, and more particularly, to a flexible integrated display module, manufacturing method thereof, and display device.

BACKGROUND OF INVENTION

Flexible organic light emitting diode (OLED) refers to as flexible organic light-emitting diode. Flexible OLEDs are manufactured based on flexible substrate and operates on flexible substrate. Compared with traditional glass display devices, flexible OLEDs are more flexible, lighter and thinner.

OLED light-emitting devices are currently mainly used in smart phones, household appliances, televisions, smart watches, VR devices, etc., wherein the application ratio in smart phones is highest and reaches 70.6%. The key advantage of OLED light-emitting devices is in their flexibility, which achieves "flexible" display and increases application scenarios and imagination of traditional display device.

Due to the differences with structure, material properties, and luminescence principles between OLED light-emitting devices and TFT-LCD devices, OLED light-emitting devices are more suitable for manufacturing flexible panels. Currently, flexible panels are also widely referred to as curved panels, because they present a fixed curved surface, but that is not truly "flexible", the display also needs to be supported by glass, which has its insurmountable bending barrier.

"Flexible" panels currently head toward two goals, bendable and foldable, but the final goal is to achieve rollable panel.

Currently, a flexible integrated display module 100 as shown as FIG. 1, comprising a panel 110, a chip on film (COF) 120, a display flexible printed circuit board (display FPC) 130, and a direct on-cell touch control flexible printed circuit (DOT-TP-FPC, wherein DOT: direct on-cell touch, TP: touch panel) 140, wherein the panel mainly is used to display image. An active area 101 is the area in which the image is displayed in the panel in FIG. 1 and is the core component of the display module. The panel further comprises a non-active area 102. The COF 120 is used to provide a signal to drive the panel 110 display image, an IC of the COF 121 is used to generate a circuit driving signal on the panel 110, and the COF 120 between the IC of the COF 121 and the panel 110 is densely distributed with wirings for conducting signals. The function of the DOT-TP-FPC 140 is mainly to provide a driving signal to the touch panel integrated on the panel 110. The display FPC 130 connected to the COF 120 and the flexible printed circuit board for external driving system of the DOT-TP-FPC 140, which is mainly to provide a control driving signal to the IC of the COF 121 and an IC of the DOT-TP-FPC 141.

Flexible foldable display modules currently have some disadvantages: first, currently, COF, display FPC and DOT-TP-FPC in flexible folding display modules are mostly produced by external partners, which is difficult to control their quality and cost. Second, flexible folding display modules have complicated structure and many components, for example, flexible printed circuit boards and panels or flexible printed circuit boards and flexible printed circuit boards need to perform bonding process. A total of 4 to 5 process steps are required. The bonding process is prone to laminate offset between the flexible printed circuit board and the panel, and generates particle, poor laminate contact and other poor phenomena. Long flow process is easy to lead to decline overall yield and increase cost. Third, each component is bonding each other by bonding process. The flexible printed circuit board has some hard components such as an IC, and when the flexible display module is manufactured into a foldable product or a rollable product, the IC and the connecting channel between the flexible printed circuit board and the panel is easily damaged.

SUMMARY OF INVENTION

The object of the present disclosure is to provide a flexible integrated display module and manufacturing method thereof and display device, which provides a new design to resolve the disadvantages of flexible display panel. The panel of flexible display, the COF, the display FPC, and the DOT-TP-FPC are integrated on the flexible display substrate, and the different areas of flexible display substrate are defined as an active area for displaying images, a COF wiring functional area, a DOT-TP-FPC wiring functional area, a display FPC wiring functional area, thereby improving integration of foldable bendable flexible displays and yield, and reducing structural complexity, flow process, and overall cost.

According to one of aspect in the present disclosure, the present disclosure provides a flexible integrated display module comprising a flexible integrated display substrate, the flexible integrated display substrate comprises an integrated area, an active area disposed at one side of the integrated area and a non-active area disposed surrounding the active area, and the integrated area divided into a plurality of areas, each of the areas defined as a corresponding functional area. The functional area comprises a display wiring functional area and a plurality of direct on-cell touch control wiring functional areas, the plurality of direct on-cell touch control wiring functional areas disposed on both sides of the display functional area, the display functional area is used to set a display wiring and a chip on film packaging wiring, and the direct on-cell touch control wiring functional areas are used to set a direct on-cell touch control wiring.

Further, the flexible integrated display module further comprises a touch control display driving integrated circuit chip laminated on the integrated area of the flexible integrated display substrate, the touch control display driving integrated circuit chip is used to generate a driving signal for display and touch control circuit of the active area and the non-active area, and provide a driving signal to a touch control panel of the corresponding active area and the non-active area.

Further, the flexible integrated display module further comprises a touch control display driving integrated circuit chip disposed on a flexible printed circuit board for external driving system of the flexible integrated display substrate or an external fixable printed circuit board, the touch control display driving integrated circuit chip is used to generate a driving signal for display and touch control circuit of the active area and the non-active area, and provide a driving signal to a touch control panel of the corresponding active area and the non-active area.

According to other aspects of the present disclosure, the present disclosure provides a manufacturing method of flexible integrated display module comprising steps as below: providing a flexible integrated display substrate;

defining an integrated area on the flexible integrated display substrate, dividing the integrated area into a plurality of areas, defining each of the areas as a corresponding functional area; dividing one side of the integrated area on the flexible integrated display substrate into an active area and a non-active area; forming a functional wiring film layer on the corresponding functional area by physical vapor deposition method; performing coating a photoresist, exposure, and development on the functional wiring film layer to make the photoresist patterned; patterning the functional wiring film layer under the photoresist by etching method, and corresponding to the patterned photoresist; and stripping the patterned photoresist.

Further, after the step of stripping the patterned photoresist, further comprising defining a bonding area in the integrated area; cleaning the bonding area; attaching an anisotropic conductive film layer to the bonding area; disposing a touch control display driving integrated circuit chip on the anisotropic conductive film layer by pre-laminating method; and performing main-press to the touch control display driving integrated circuit chip.

Further, after the step of stripping the patterned photoresist, further comprising defining a bonding area on an external driving system printed circuit board of the flexible integrated display substrate; cleaning the bonding area; attaching an anisotropic conductive film layer to the bonding area; disposing a touch control display driving integrated circuit chip on the anisotropic conductive film layer by pre-laminating method; and performing main-press to the touch control display driving integrated circuit chip.

Further, in the step of defining a bonding area, further comprising manufacturing a connector for connecting the flexible integrated display substrate and external driving system printed circuit board by surface assembly technology.

According to other aspect of the present disclosure, the present disclosure provides a display device comprises a flexible integrated display module above mentioned.

The advantage of the present disclosure is that, a flexible integrated display module provides a new design to resolve the disadvantages of flexible display panel. The panel of flexible display, the COF, the display FPC, and the DOT-TP-FPC are integrated on the flexible display substrate, and the different areas of flexible display substrate are defined as an active area for displaying images, a COF wiring functional area, a DOT-TP-FPC wiring functional area, a display FPC wiring functional area, thereby improving integration of foldable bendable flexible displays and yield, and reducing structural complexity, flow process, and overall cost.

DESCRIPTION OF DRAWINGS

In order to more clearly illustrate the technical solutions of the embodiments of the present invention, the drawings used in the description of the embodiments will be briefly described as below, apparently, the drawings described as below are just some embodiments of the present invention, for the person having ordinary skill in the art, under the premise of no creative labor, the other drawings also can be obtained according to these drawings.

DETAILED DESCRIPTION OF PREFERRED EMBODIMENTS

Figure 1:
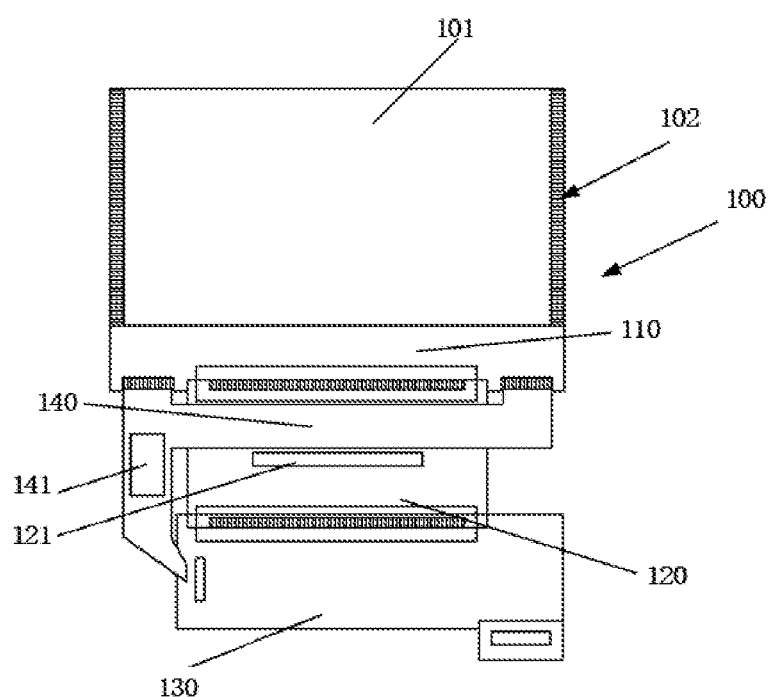
FIG. 1 is a schematic structural diagram of foldable flexible display device in the prior art.

The technical solutions in the embodiments of the present disclosure will be clearly and completely described below in conjunction with the accompanying drawings in the embodiments of the present disclosure. Obviously, the embodiments described are merely a part of the present disclosure, rather than all the embodiments. All other embodiments obtained by the person having ordinary skill in the art based on embodiments of the disclosure, without making creative efforts, are within the scope of the present disclosure.

The terms such as "first", "second", "third", etc., in the specification, claims and aforesaid figures of the present invention are used for distinguishing different objects but not for describing the specific sequence. It is to be understood that the terms so used are interchangeable under appropriate circumstances. Furthermore, the terms "comprising", "including" and its any deformations are intended to cover non-exclusive inclusion.

In the present disclosure, the drawings described as below and each embodiment of the principles in the present disclosure are is used to explanate, but not to be construed as limiting the scope of the disclosure. The person having ordinary skill in the art will appreciate that the principles of the present disclosure may be implemented in any suitably arranged system. Exemplary embodiments will be described in detail, examples of which are illustrated in the accompanying drawings. Further, a terminal according to an exemplary embodiment will be described in detail with reference to the accompanying drawings. The same reference numerals in the drawings are indicated by the same elements.

The terms used in the description of the present disclosure is to describe particular embodiments, and is not intended to disclose the concepts of the present disclosure. Unless the context has a clearly different meaning, the expression used in the singular form covers the expression of plural form. In the present specification, it should be understood that terms such as "including", "having" and "comprising", etc., disclosed in the present specification are intended to illustrate the possibility of features, numbers, steps, acts, or combinations thereof in the present specification, and are not intended to preclude the possibility that there may be or may be added one or more other features, numbers, steps, acts, or combinations thereof. The same reference numerals in the drawings are indicated by the same elements The present embodiment provides a flexible integrated display module and manufacturing method thereof and display device. The details will be described separately below.

Figure 2:
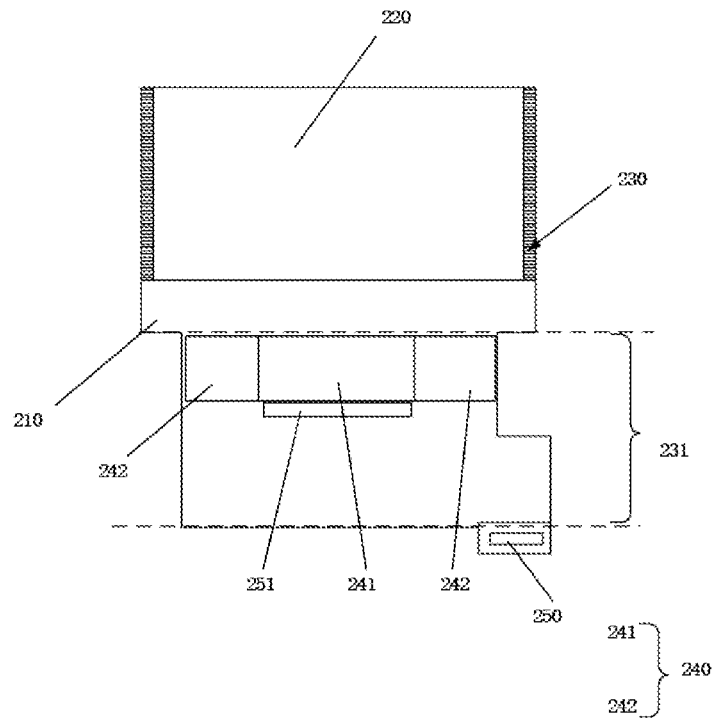
FIG. 2 is a schematic structural diagram of flexible integrated display module of one embodiment in the present disclosure.
Figure 3:
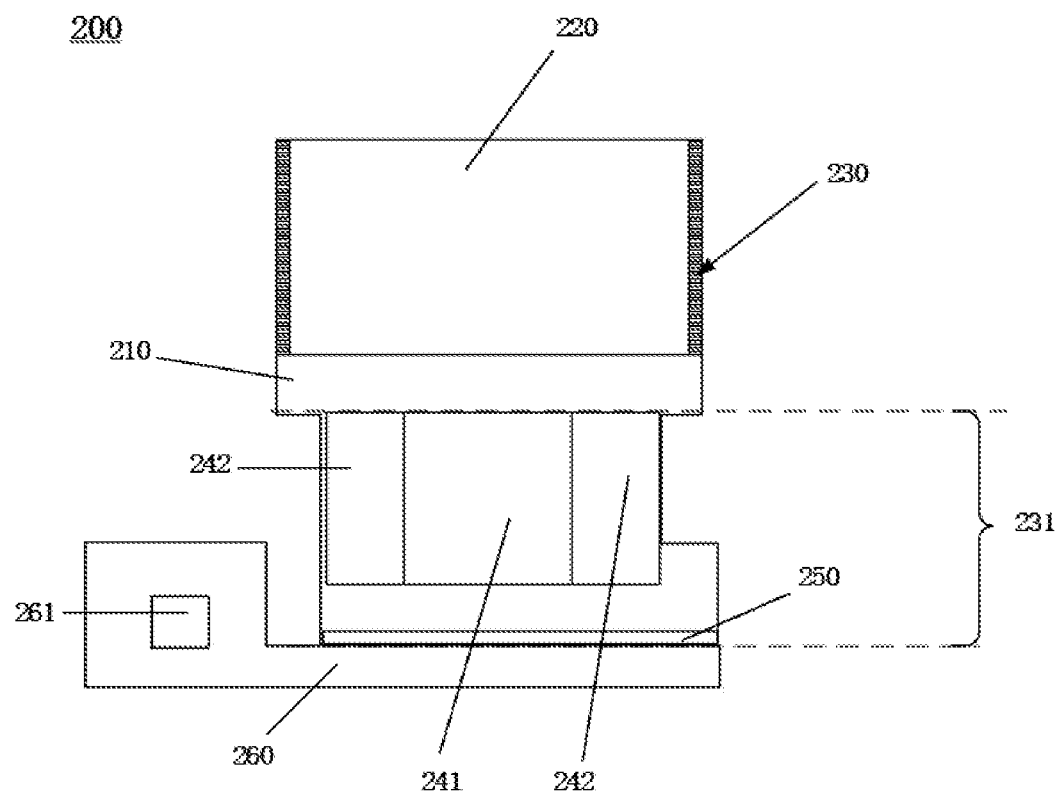
FIG. 3 is a schematic structural diagram of flexible integrated display module of other embodiment in the present disclosure.

Referring to FIG. 2 and FIG. 3, according to one aspect of the present disclosure, the present disclosure provides a flexible integrated display module 200 comprising a flexible integrated display substrate 210. The flexible integrated display substrate 210 comprises an integrated area 231, an active area 220 disposed at one side of the integrated area 231 and a non-active area 230 disposed surrounding the active area 220, the integrated area 231 divided into a plurality of areas 240, each of the areas defined as a corresponding functional area 240 (the functional areas below use the same numeral).

Figure 2A:
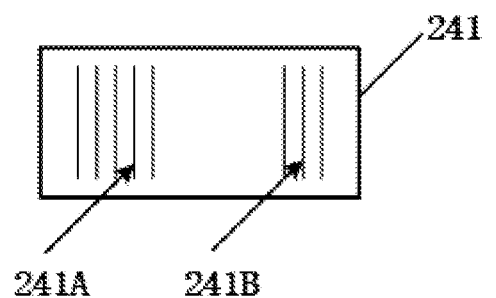
FIG. 2A and FIG. 2B are schematic diagrams respectively of the display wiring functional areas and the direct on-cell touch control wiring functional areas.
Figure 2B:
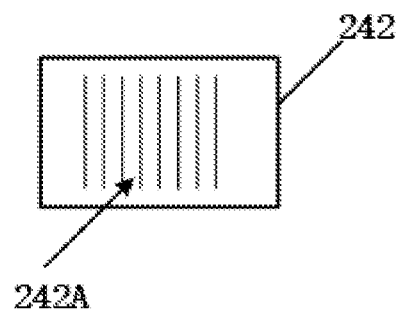

Wherein, the functional area 240 comprises a display wiring functional area 241 and a plurality of direct on-cell touch control wiring functional areas 242, the plurality of direct on-cell touch control wiring functional areas 242 disposed on both sides of the display functional area 241, but not limited to this. The display functional area 241 is used to set a display wiring (namely display FPC, a wiring of flexible printed circuit boards is used to display function, hereinafter called display wirings) 241A, and a chip on film wiring (namely COF FPC, a wiring of flexible printed circuit boards is used to chip on film function, hereinafter called chip on film wirings) 241B, as shown as FIG. 2A. The direct on-cell touch control wiring functional areas 242 is used to set a direct on-cell touch control wiring (namely DOT FPC, a wiring of flexible printed circuit boards is used to direct on-cell touch control wiring function, hereinafter called direct on-cell touch control wirings, the DOT FPC is indicated DOT-TP-FPC wirings in the present disclosure) 242A, as shown as FIG. 2B.

In present embodiment, the flexible integrated display module 200 further comprises a touch control display driving integrated circuit chip 251, the touch control display driving integrated circuit chip 251 laminated on the integrated area 231 of the flexible integrated display substrate 210, the touch control display driving integrated circuit chip 251 is used to generate a driving signal for display and touch control circuit on the panel (the numeral 110 as shown as FIG. 1, comprising the active area and the non-active area), and provide a driving signal to a touch control panel of the corresponding active area and the non-active area. In this way, the functional wirings in the original DOT FPC, the COF FPC and the display FPC can be integrated on the integrated area 231 of the flexible integrated display substrate 210 without the bonding process, which can not only save the bonding process cost, but also avoid poor bonding risk.

As shown as FIG. 3, in other embodiments, the flexible integrated display module 200 further comprises a touch control display driving integrated circuit chip 261, the touch control display driving integrated circuit chip 261 disposed on a flexible printed circuit board 260 for external driving system of the flexible integrated display substrate or an external fixable printed circuit board, the touch control display driving integrated circuit chip 261 is used to generate a driving signal for display and touch control circuit of the active area and the non-active area, and provide a driving signal to a touch control panel of the corresponding active area and the non-active area. Furthermore, the external driving system printed circuit board connected to the flexible integrated display substrate 210 by a connector 250. In other embodiments of present disclosure, the external driving system printed circuit board also can be connected to the flexible integrated display substrate 210 by other devices, but not limited to the connector 250.

Figure 4:
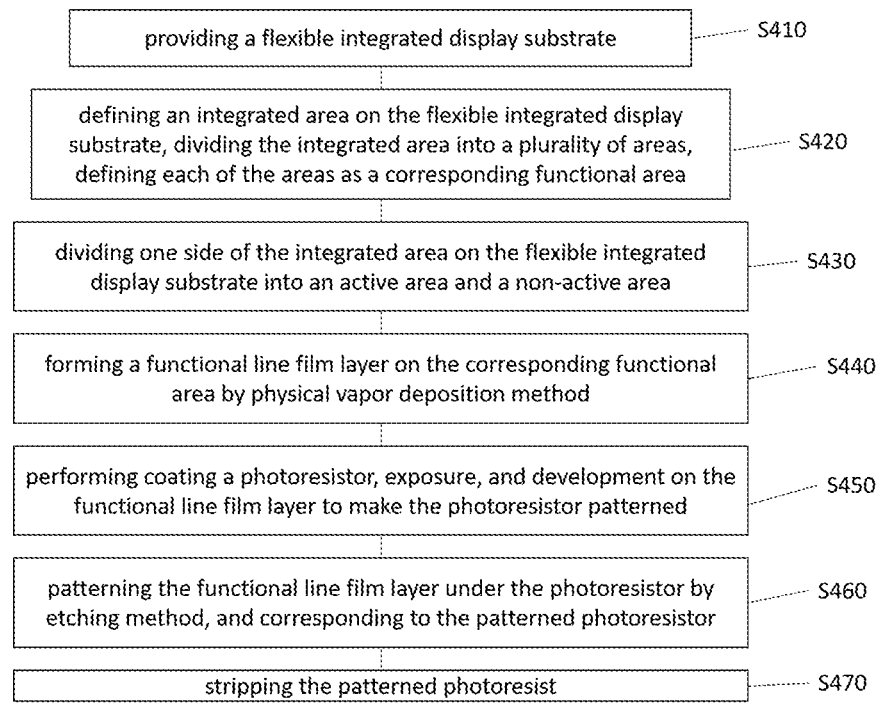
FIG. 4 is a step flow chart of manufacturing method of flexible integrated display module of the embodiment in the present disclosure.

As shown as FIG. 4, the present disclosure provides a manufacturing method of flexible integrated display module comprising steps as below:

Step S410: providing a flexible integrated display substrate.

Step S420: defining an integrated area on the flexible integrated display substrate, dividing the integrated area into a plurality of areas, defining each of the areas as a corresponding functional area.

The functional area comprises a display wiring functional area and a plurality of direct on-cell touch control wiring functional areas, the plurality of direct on-cell touch control wiring functional areas disposed on both sides of the display functional area. The display functional area is used to set a display wiring and a chip on film wiring. The direct on-cell touch control wiring functional areas is used to set a direct on-cell touch control wiring.

Wherein, the chip on film wiring 241B, the direct on-cell touch control wiring 242A, the display flexible printed circuit wiring 241A can be integrated on the same mask plate with the wiring design of panel by the following processes such as film formation, photolithography, etching, etc.

Step S430: dividing one side of the integrated area on the flexible integrated display substrate into an active area and a non-active area.

Step S440: forming a functional wiring film layer on the corresponding functional area by physical vapor deposition method.

Step 450: performing coating a photoresist, exposure, and development on the functional wiring film layer to make the photoresist patterned.

Step S460: patterning the functional wiring film layer under the photoresist by etching method, and corresponding to the patterned photoresist.

Step S470: stripping the patterned photoresist.

Figure 5:
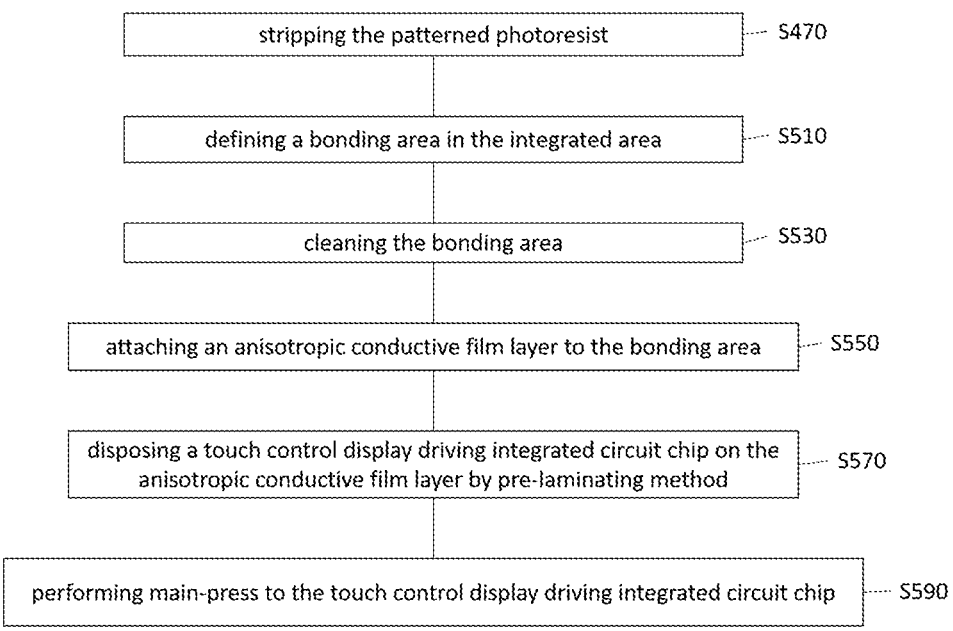
FIG. 5 and FIG. 6 are step flow charts respectively after step S470 in FIG. 4.

Referring to FIG. 5, in the present embodiment, after the step of stripping the patterned photoresist, further comprising:

Step S510: defining a bonding area in the integrated area.

Step S530: cleaning the bonding area.

Step S550: attaching an anisotropic conductive film layer to the bonding area.

Wherein, the anisotropic conductive film layer is ACF layer.

Step S570: disposing a touch control display driving integrated circuit chip on the anisotropic conductive film layer by pre-laminating method.

Step S590: performing main-press to the touch control display driving integrated circuit chip.

Figure 6:
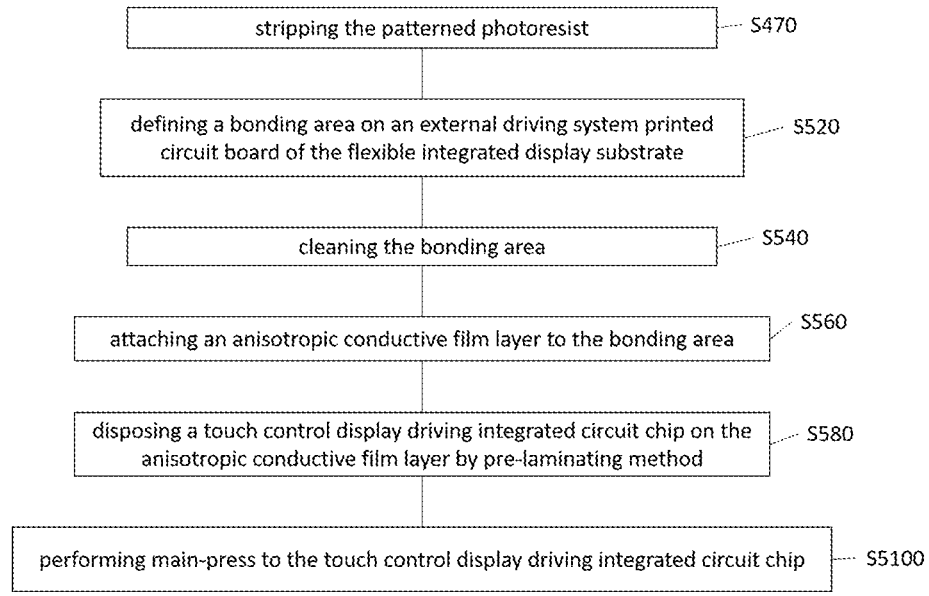

Referring to FIG. 6, in other embodiments, after the step of stripping the patterned photoresist, further comprising:

Step S520: defining a bonding area on an external driving system printed circuit board of the flexible integrated display substrate.

Step S540: cleaning the bonding area.

Step S560: attaching an anisotropic conductive film layer to the bonding area.

Wherein, the anisotropic conductive film layer is ACF layer.

Step S580: disposing a touch control display driving integrated circuit chip on the anisotropic conductive film layer by pre-laminating method.

Step S5100: performing main-press to the touch control display driving integrated circuit chip.

Figure 7:
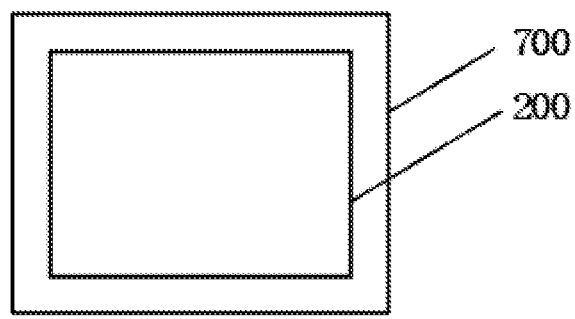
FIG. 7 is a schematic structural diagram of display device of one embodiment in the present disclosure

Referring to FIG. 7, according to one of aspect of the present disclosure, the present disclosure provides a display device 700 comprising a flexible integrated display module 200 above mentioned. The display device may be any product or component having a display function such as a liquid crystal television, a liquid crystal display device (for example, a flexible display, an efficient display), a mobile phone, a digital photo frame, a tablet computer, or the like.

The advantage of the present disclosure is that, a flexible integrated display module provides a new design to resolve the disadvantages of flexible display panel. The panel of flexible display, the COF, the display FPC, and the DOT-TP-FPC are integrated on the flexible display substrate, and the different areas of flexible display substrate are defined as an active area for displaying images, a COF wiring functional area, a DOT-TP-FPC wiring functional area, a display FPC wiring functional area, thereby improving integration of foldable bendable flexible displays and yield, and reducing structural complexity, flow process, and overall cost.

Although the present invention has been described with reference to the preferred embodiments thereof, it is noted that the person having ordinary skill in the art may appreciate improvements and modifications without departing from the principle of the present invention and those improvements and modifications are considered within the scope of protection of the present invention.

What is claimed is:

1. A flexible integrated display panel module, comprising:
    a flexible integrated display substrate;
        the flexible integrated display substrate comprising an integrated area, an active area disposed at one side of the integrated area, and a non-active area disposed surrounding the active area, the integrated area divided into a plurality of areas, each of the areas defined as a corresponding functional area;
        the functional area comprising: a display wiring functional area and a plurality of direct on-cell touch control wiring functional areas, the plurality of direct on-cell touch control wiring functional areas disposed on both sides of the display functional area; the display functional area used to set a display wiring and a chip on film packaging wiring; and the direct on-cell touch control wiring functional areas used to set a direct on-cell touch control wiring,
        wherein the flexible integrated display panel module further comprises a touch control display driving integrated circuit chip, the touch control display driving integrated circuit chip laminated on the integrated area of the flexible integrated display substrate.

2. The flexible integrated display panel module as claimed in claim 1, wherein the touch control display driving integrated circuit chip used to generate a driving signal for display and touch control circuit of the active area and the non-active area, and provide a driving signal to a touch control panel of the corresponding active area and the non-active area.

3. The flexible integrated display panel module as claimed in claim 1, wherein the flexible integrated display panel module comprises a touch control display driving integrated circuit chip, the touch control display driving integrated circuit chip disposed on an external driving system printed circuit board or on an external fixable printed circuit board of the flexible integrated display substrate, the touch control display driving integrated circuit chip used to generate a driving signal for display and touch control circuit of the active area and the non-active area, and provide a driving signal to a touch control panel of the corresponding active area and the non-active area.

4. The flexible integrated display panel module as claimed in claim 3, wherein the external driving system printed circuit board connected to the flexible integrated display substrate by a connector.

5. A display device, comprising a flexible integrated display panel module as claimed in claim 1.

6. A manufacturing method of a flexible integrated display panel module, comprising steps as below:
    providing a flexible integrated display substrate;
    forming an integrated area on the flexible integrated display substrate, dividing the integrated area into a plurality of areas, each of the areas defining a corresponding functional area;
    dividing one side of the integrated area on the flexible integrated display substrate into an active area and a non-active area;
    forming a functional wiring film layer on the corresponding functional area by physical vapor deposition method;
    performing a photoresist coating, exposure, and development on the functional wiring film layer to pattern the photoresist;
    patterning the functional wiring film layer under the photoresist by etching method, and corresponding to the patterned photoresist; and
    stripping the patterned photoresist,
    wherein after the step of stripping the patterned photoresist, comprising:
    defining a bonding area in the integrated area;
    cleaning the bonding area;
    attaching an anisotropic conductive film layer to the bonding area;
    disposing a touch control display driving integrated circuit chip on the anisotropic conductive film layer by pre-laminating method; and
    performing main-press to the touch control display driving integrated circuit chip.

7. The manufacturing method of flexible integrated display panel module as claimed in claim 6, wherein after the step of stripping the patterned photoresist, comprising:
    defining a bonding area on an external driving system printed circuit board of the flexible integrated display substrate;
    cleaning the bonding area;
    attaching an anisotropic conductive film layer to the bonding area;
    disposing a touch control display driving integrated circuit chip on the anisotropic conductive film layer by pre-laminating method; and
    performing main-press to the touch control display driving integrated circuit chip.

8. The manufacturing method of flexible integrated display panel module as claimed in claim 7, wherein in the step of defining a bonding area, comprising manufacturing a connector for connecting the flexible integrated display substrate and external driving system printed circuit board by surface assembly technology.

* * * * *